(12) United States Patent
Outten et al.

(10) Patent No.: US 10,573,495 B2
(45) Date of Patent: Feb. 25, 2020

(54) SELF-NEUTRALIZED RADIO FREQUENCY PLASMA ION SOURCE

(71) Applicant: Denton Vacuum, LLC, Moorestown, NJ (US)

(72) Inventors: Craig A. Outten, Rydal, PA (US); David Konopka, Bensalem, PA (US)

(73) Assignee: DENTON VACUUM, LLC, Moorestown, NJ (US)

( * ) Notice: Subject to any disclaimer, the term of this patent is extended or adjusted under 35 U.S.C. 154(b) by 0 days.

(21) Appl. No.: 16/151,478

(22) Filed: Oct. 4, 2018

(65) Prior Publication Data
US 2019/0108978 A1 Apr. 11, 2019

Related U.S. Application Data

(60) Provisional application No. 62/569,706, filed on Oct. 9, 2017.

(51) Int. Cl.
*H01J 37/32* (2006.01)
*H05H 1/46* (2006.01)
*H01J 37/08* (2006.01)

(52) U.S. Cl.
CPC ........ *H01J 37/32183* (2013.01); *H01J 37/08* (2013.01); *H01J 37/3211* (2013.01);
(Continued)

(58) Field of Classification Search
CPC ............... H01J 37/321; H01J 37/32935; H01J 37/32082; H01J 37/32174; H01J 37/32091; H01J 37/32183; H01J 37/08; H01J 37/32165; H01J 37/3299; H01J 37/32009; H01J 37/3244; H01J 37/32422; H01J 37/3211; H01J 37/32357; H01J 37/32412; H01J 37/3053; H01J 37/32623; H01J 37/3171; H01J 37/32146; H01J 37/32192; H01J 37/32577; H01J 37/3266; H01J 37/32715; H01J 37/32972;
(Continued)

(56) References Cited

U.S. PATENT DOCUMENTS

5,036,252 A 7/1991 Löb
6,936,144 B2 8/2005 Weiler et al.
(Continued)

*Primary Examiner* — Tung X Le
*Assistant Examiner* — Borna Alaeddini
(74) *Attorney, Agent, or Firm* — Hoffmann & Baron, LLP (57) ABSTRACT

A plasma ion source includes a plasma generation unit comprising a plasma discharge chamber adapted to generate and sustain a plasma confined therein, a gas distribution unit adapted to deliver a working gas into an interior of the plasma discharge chamber, an ignition unit adapted to stimulate ionization of the working gas to generate a stable plasma, an electrode bias unit configured to apply an electrostatic potential to charged species in the plasma discharge, and an ion extraction unit configured to accelerate the charged species out of the ion extraction unit to generate a quasi-neutral plasma ion beam. The plasma ion source further includes a vacuum integrated matching network coupled with the plasma generation and electrode bias units. The matching network resides with the plasma generation and electrode bias units in a vacuum chamber during operation of the plasma ion source.

14 Claims, 8 Drawing Sheets

(52) U.S. Cl.
CPC ......... *H01J 37/32091* (2013.01); *H05H 1/46* (2013.01); *H05H 2001/4667* (2013.01)

(58) Field of Classification Search
CPC ........... H01J 37/32018; H01J 37/32339; H01J 37/32458; H01J 37/32522; H01J 37/32724; H01J 37/32862; H01J 37/34; H01J 37/3408; H01J 37/241; H01J 37/244; H01J 37/248; H01J 37/30; H01J 37/32027; H01J 37/32036; H01J 37/32045; H01J 37/32055; H01J 37/32119; H01J 37/32137; H01J 37/32266; H01J 37/32321; H01J 37/3233; H01J 37/32376; H01J 37/32385; H01J 37/32431; H01J 37/32449; H01J 37/32467; H01J 37/32477; H01J 37/32532; H01J 37/3255; H01J 37/32568; H01J 37/32633; H01J 37/32642; H01J 37/32651; H01J 37/32669; H01J 37/32678; H01J 37/32688; H01J 37/32697; H01J 37/32706; H01J 37/32807; H01J 37/32871; H01J 37/3405; H01J 37/3411; H01J 37/3417; H01J 37/3444; H01J 37/347; H01J 37/3488; H01J 2237/334; H01J 2237/0815; H01J 2237/061; H01J 2237/08; H01J 2237/083; H01J 2237/327; H01J 2237/0213; H01J 2237/03; H01J 2237/0817; H01J 2237/16; H01J 2237/24542; H01J 2237/31749; H01J 2237/332; H01J 2237/3321; H01J 2237/022; H01J 2237/0802; H01J 2237/24564; H01J 2237/3341; H01J 27/205; H01J 27/26; H01J 27/16; H01J 27/18; H05H 1/46

See application file for complete search history.

(56) References Cited

U.S. PATENT DOCUMENTS

| | | | |
|---|---|---|---|
| 7,241,361 B2 | 7/2007 | Keller et al. | |
| 7,276,816 B2 | 10/2007 | Weiler et al. | |
| 8,356,575 B2* | 1/2013 | Sasaki | H01J 37/3053 118/723 I |
| 2006/0196426 A1* | 9/2006 | Gluck | H01J 37/32082 118/723 R |
| 2009/0189083 A1* | 7/2009 | Godyak | H01J 27/18 250/423 R |
| 2011/0303635 A1* | 12/2011 | Takahashi | H01J 37/32082 216/13 |
| 2012/0211166 A1* | 8/2012 | Yevtukhov | H01J 27/18 156/345.51 |
| 2013/0084707 A1* | 4/2013 | Hashimoto | H01J 37/32862 438/710 |
| 2014/0097751 A1* | 4/2014 | Thomas | H01J 37/321 315/111.21 |

* cited by examiner

SELF-NEUTRALIZED RADIO FREQUENCY PLASMA ION SOURCE

CROSS-REFERENCE TO RELATED APPLICATIONS

This application claims the benefit of U.S. Provisional Patent Application No. 62/569,706 filed on Oct. 9, 2017 and entitled "Self-Neutralized Radio-Frequency Plasma Ion Source," the complete disclosure of which is expressly incorporated herein by reference in its entirety for all purposes.

FIELD

The present invention relates generally to the electrical, electronic and computer arts, and, more particularly, to methods and apparatus for excitation of a gas discharge (plasma).

BACKGROUND

Plasma systems are of significance for production, processing and treatment of solid-state materials, among other applications. Plasma reactors, also known as plasma sources, can be used in many plasma processing applications, including, but not limited to, growth of thin films, dispersion, etching and cleaning. These plasma processing applications often require precisely-controlled application of excited or ionized particles. For example, the effects of ions, electrons and other energetic particles are now widely utilized for substrate cleaning as well as to assist and control film growth. Some of the particles do not just assist in the film growth but they may condense and thereby become part of the growing film or structure. These particles provide energy and momentum to the film growth process, resulting in densification, sputtering/etching, modification of stress, roughness, texture, etc.

Radio frequency (RF) plasmas are attractive as electron beam sources because they allow for a design where the cathode does not participate in electron production while providing high efficiency and long life operation. Traditionally, hollow cathodes or tungsten filaments have been used as electron sources because of their high electron current density and relatively low power requirements. However, their operational lifetime is limited by cathode and filament deterioration, contamination, and barium diffusion rates, and in some cases requiring a large amount of inert feed gas, thus rendering them less suitable for use in corrosive environments and sustained use.

SUMMARY

One or more embodiments of the present invention involve techniques for providing an RF plasma ion source that generates a self-neutralized ion beam without the requirement of a secondary or auxiliary electron source to compensate for a positive space charge of the ion beam. Furthermore, in one or more embodiments, the plasma ion source is capable of independent control of ion current density (i.e., ion flux) and ion energies, which allows for a wide process window and the ability to tailor certain properties of a deposited film. One or more embodiments of the invention utilizes a vacuum integrated matching network configured to provide optimal power coupling between an induction coil and a plasma discharge, while simultaneously allowing for fine control of the ion energies.

An exemplary self-neutralized, high-frequency plasma ion source, according to an embodiment of the invention, comprises a plasma generation unit including a plasma discharge chamber adapted to generate and sustain a plasma confined therein, a gas distribution unit adapted to deliver a working gas into an interior of the plasma discharge chamber, an ignition unit adapted to stimulate ionization of the working gas to thereby generate a cascade of plasma gas resulting in a stable plasma discharge, an electrode bias unit configured to apply an electrostatic potential to charged species in the plasma discharge, and an ion extraction unit disposed at an end of the plasma discharge chamber opposite the electrode bias unit, the ion extraction unit being configured to accelerate the charged species out of the ion extraction unit to generate an output quasi-neutral plasma ion beam. The plasma ion source further includes a vacuum integrated matching network operatively coupled with the plasma generation unit and the electrode bias unit, the matching network being configured to facilitate optimal power transfer from the plasma generation unit. The matching network resides with the plasma generation unit and electrode bias unit in a vacuum chamber during operation of the plasma ion source.

In accordance with another embodiment of the invention, an exemplary high-frequency plasma ion source comprises a plasma generation unit including a plasma discharge chamber adapted to generate and sustain a plasma confined therein, a gas distribution unit adapted to deliver a working gas into an interior of the plasma discharge chamber, an ignition unit adapted to stimulate ionization of the working gas to thereby generate a stable plasma, an electrode bias unit configured to apply an electrostatic potential to charged species in the plasma discharge, and an ion extraction unit disposed at an end of the plasma discharge chamber opposite the electrode bias unit, the ion extraction unit being configured to accelerate the charged species out of the ion extraction unit to generate an output quasi-neutral plasma ion beam. The plasma ion source further includes a vacuum integrated matching network operatively coupled with the plasma generation unit and the electrode bias unit, the matching network being configured to facilitate optimal power transfer from the plasma generation unit. The plasma generation unit and the electrode bias unit are configured such that ion current density in the plasma discharge chamber is controlled as a function of RF power applied to the plasma generation unit, and ion energy is independently controlled as a function of DC and RF bias voltages applied to a bias electrode of the electrode bias unit.

As may be used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Various units, circuits, modules, or other components may be described herein as being "configured to" perform a particular task or tasks. In such contexts, the term "configured to" is intended to be construed broadly as a recitation of structure generally meaning "having circuitry or hardware that" performs the particular task or tasks during operation. As such, the unit, circuit, module, or component can be configured to perform the subject task or tasks even when the unit, circuit, module, or component is not currently powered on. In general, circuitry or hardware that forms the structure corresponding to "configured to" may include hardware circuits and/or memory storing program instructions executable to implement the stated operation. Similarly, various units, circuits, modules, or components may be described as performing a task or tasks, for convenience in the description. Such descriptions should be interpreted as including the phrase "configured to." Reciting a unit, circuit, module, or component that is configured to perform one or more tasks is expressly intended not to invoke a 35 U.S.C. § 112, paragraph (f) interpretation for that unit, circuit, module, or component.

Techniques according to embodiments of the present invention provide substantial beneficial technical effects. By way of example only and without limitation, one or more embodiments of the invention achieve one or more of the following, among other benefits:

An RF plasma ion source that generates a self-neutralized ion beam without the need for a secondary or auxiliary electron source to compensate for the positive space charge of the ion beam;

An RF plasma ion source is capable of independent control of ion current density (i.e., ion flux) and ion energies;

An RF plasma ion source that can be positioned inside a vacuum deposition chamber without spatial restrictions due to disposition of a vacuum integrated matching network adjacent to the RF antenna coil.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention will be described herein in the context of illustrative apparatus and methods for generating a quasi-neutral beam of radio frequency (RF) charged ions with independent control of ion current density and ion energy over large coverage areas. In one or more embodiments, methods and apparatus are provided which integrate an RF impedance matching network, configured to facilitate optimal power transfer, within a vacuum chamber in which a source load resides. In one or more embodiments, methods and apparatus are provided which beneficially enable independent control of ion current density and ion energy by a novel application of direct current (DC) and RF voltages to a bias electrode. It is to be appreciated, however, that the invention is not limited to the specific apparatus, systems and/or methods illustratively shown and described herein. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Figure 1:
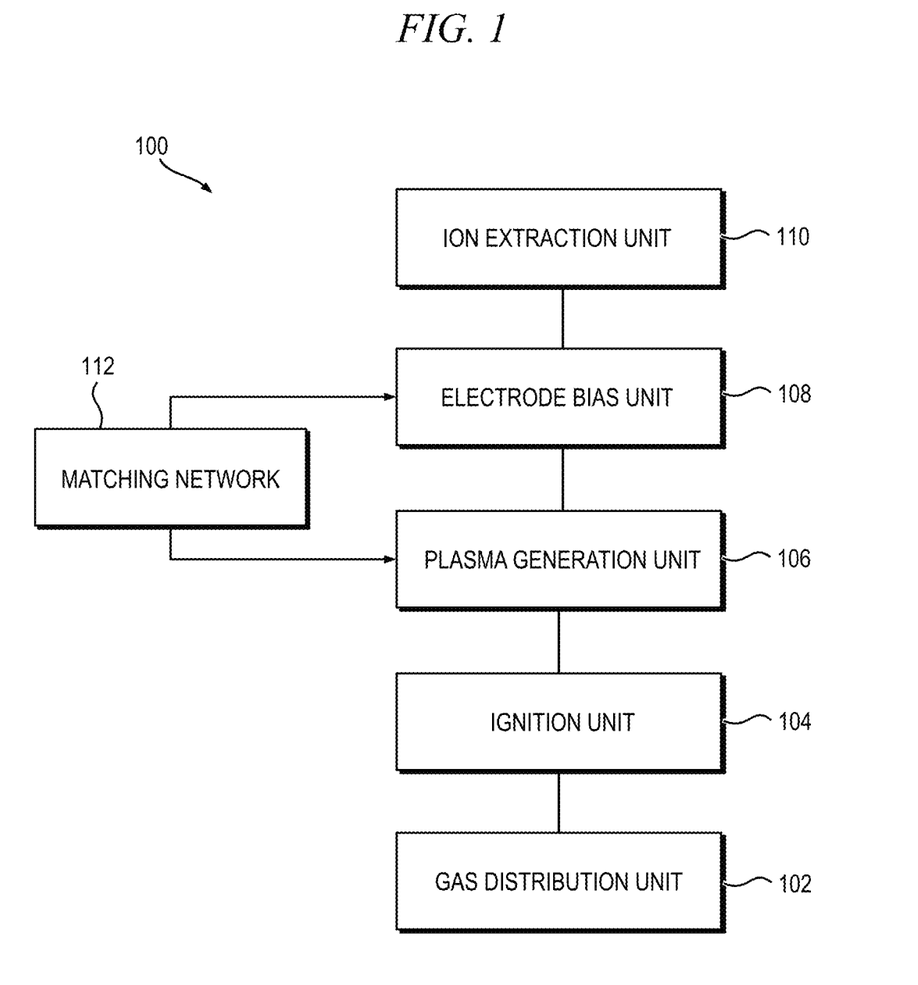
FIG. 1 is a block diagram depicting at least a portion of an exemplary apparatus for generating a self-neutralized radio frequency (RF), or other high-frequency, plasma ion source, according to an embodiment of the present invention.
Figure 2:
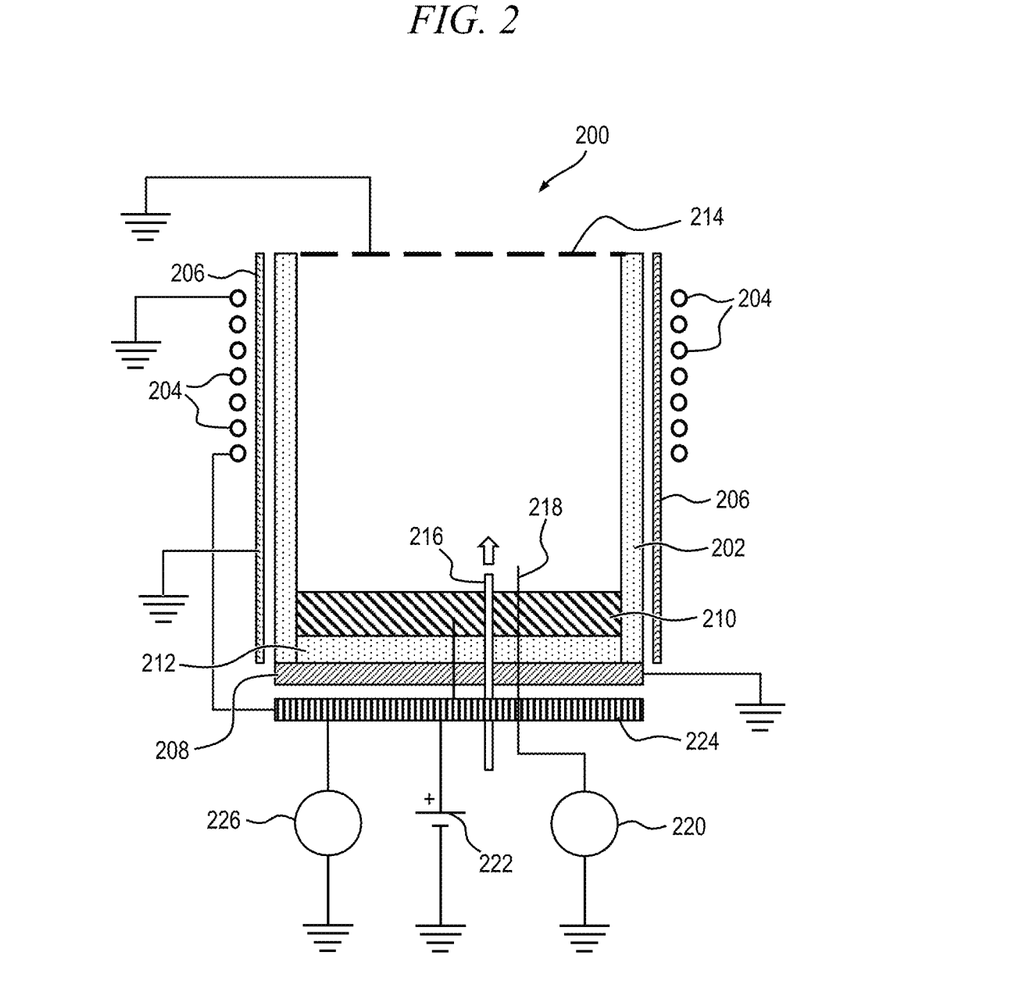
FIG. 2 is a cross-sectional view illustrating at least a portion of an exemplary plasma ion source for generating a self-neutralized RF plasma ion beam, according to an embodiment of the present invention.

An illustrative apparatus 100 for generating a self-neutralized high-frequency (e.g., RF) plasma ion source in accordance with an embodiment of the invention will now be described in conjunction with FIGS. 1 and 2; FIG. 1 is a top level block diagram conceptually depicting at least a portion of the illustrative apparatus 100, and FIG. 2 is a cross-sectional view illustrating at least a portion of an exemplary implementation of the apparatus, according to one or more embodiments of the invention. The high-frequency plasma ion source 100 can be used for generation of a quasi-neutral beam of charged ions (e.g., positive ions) with independent control of ion current density and ion energy over large coverage areas, according to one or more embodiments.

With reference to FIG. 1, the high-frequency plasma ion source 100 preferably includes a gas distribution unit 102, an ignition unit 104, a plasma generation unit 106, an electrode bias unit 108 and an ion extraction unit 110. The plasma generation unit 106 includes a plasma discharge chamber configured to confine the plasma, as will be described in further detail herein below. The gas distribution unit 102 is adapted to deliver a non-reactive and reactive working gas (e.g., argon, oxygen, nitrogen, etc.) or gas mixtures into an interior of the plasma ion source 100, such as into the plasma discharge chamber of the plasma generation unit 106. Simply, the ignition unit 104 is adapted to ignite the working gas, confined within the plasma generation unit 106, to generate and sustain the plasma. For the case of atmospheric ambient pressure conditions, ignition is often accomplished with the aid of a coil (e.g., Tesla coil), which produces high-frequency, high-voltage electric sparks that induce local arc-break inside the plasma generation unit 106 and stimulate a cascade of ionization of plasma gas, ultimately resulting in a stable plasma. Alternative gas ignition mechanisms (e.g., ignitor wire, glow plug, etc.) are similarly contemplated in accordance with other embodiments.

The electrode bias unit 108, in one or more embodiments, includes an electrically floating bias electrode that is located in the interior of a dielectric discharge chamber or tube. The bias unit 108 functions to apply an electrostatic potential (e.g., a capacitive and DC positive electrostatic potential) to charged species—positive ions and electrons—in the plasma discharge. The ion extraction unit 110 and the bias electrode work in conjunction with one another to accelerate positive ions and electrons in the plasma discharge out of the extraction unit to generate an output quasi-neutral plasma beam or ion beam. Thus, the high-frequency plasma ion source 100 comprises, in one or more embodiments, both capacitive and inductive units that provide for generation of a high-density plasma and acceleration of positive ions and electrons within the plasma through the extraction unit 110 integrated into the plasma ion source 100. In addition, ion dosage or ion current density is independently controlled and adjusted by the electrode bias unit 108 and extraction unit 110 from the plasma generation unit 106. The independent control of ion energy and ion dose beneficially provides for a wide process window and tailoring of one or more ion beam parameters to a variety of applications.

In one or more embodiments, the extraction unit 110 comprises a single grid or mesh of conductive material having apertures or openings therein (e.g., holes, slits, etc.) configured to enable the extraction of a quasi-neutral plasma beam. Various conductive (e.g., metallic) materials are contemplated by embodiments of the invention, including, for example, tungsten, molybdenum, graphite, titanium, and alloys thereof, although it is to be appreciated that the invention is not limited to any specific conductive material or configuration of the apertures. The extraction unit 110, in one or more embodiments, is an integral component of the gas distribution unit 102 for the plasma ion source 100. The extraction unit 110 additionally functions as a baffle to raise the gas pressure in the interior of the plasma ion source 100 to thereby provide efficient coupling between the plasma generation unit 106, which may be implemented using an RF antenna coil for example, and the plasma discharge chamber (not explicitly shown in FIG. 1, but implied) that is used to generate the plasma ion beam. As will be described in further detail herein, a plasma discharge is confined within a dielectric discharge tube, in one or more embodiments, with the RF antenna coil surrounding the discharge tube.

The plasma ion source 100 further includes a vacuum integrated matching network 112 operatively coupled with the plasma generation unit 106 and the electrode bias unit 108. The matching network is configured to facilitate optimal power transfer from an RF generator into the RF antenna coil of the plasma generation unit 106 and plasma discharge. The matching network 112 may receive power from the electrode bias unit 108. In accordance with aspects of the invention, the matching network 112 is adapted to be vacuum compatible; that is, the matching network, in one or more embodiments, is located within the vacuum chamber. This beneficially eliminates the need for vacuum feedthroughs and other conduits for conveying power and control mechanisms between a remotely located matching network and the plasma ion source; such vacuum feedthroughs are prone to arcing or the generation of parasitic plasma discharges that reduce power transfer to the induction coil and plasma discharge.

In one or more embodiments, the matching network 112 mounts to an exterior of a bottom of the plasma ion source, with the entire integrated assembly being placed within the vacuum chamber. The integration of the matching network 112 with the plasma ion source in this manner enables faster ignition and responsiveness of the RF generator to induction coil and plasma discharge. The power coupling efficiency of this arrangement is an improvement over standard matching networks that reside remotely from their load. This novel arrangement also advantageously provides enhanced flexibility in the placement of the plasma ion source within the vacuum chamber to thereby achieve optimal ion dosage coverage, for example on planetary and dome calotte fixtures, particularly fixtures with large areas.

FIG. 2 depicts at least a portion of an exemplary plasma ion source 200 which may be used to implement the illustrative high-frequency plasma ion source 100 shown in FIG. 1, according to an embodiment of the invention. The plasma ion source 200 includes a dielectric discharge chamber or region 202, which in this illustrative embodiment is preferably shaped as a cylindrical tube. The discharge chamber 202, which defines a region wherein a generated plasma is confined and sustained, may comprise a dielectric ceramic or glass material, such as, for example, high-purity aluminum oxide ($Al_2O_3$), also referred to as alumina, or fused quartz, which possesses a low dissipation factor for RF electromagnetic waves. It is to be appreciated that embodiments of the invention are not limited to any specific shape or material used to form the dielectric discharge chamber 202, as will become apparent to those skilled in the art given the teachings herein.

An RF antenna coil 204 is disposed circumferentially about at least a portion of an exterior surface of the dielectric discharge chamber 202 and is inductively coupled with the dielectric discharge chamber for supplying a source of electromagnetic energy to an interior of the chamber when an RF signal is applied to the antenna coil. The RF antenna coil 204 is preferably comprised of a plurality of windings (i.e., turns) of conductive wire or tubing; the more windings used to form the coil, the more efficient the inductive coupling, and therefore the greater the electromagnetic energy transferred to the interior of the dielectric discharge chamber 202. In one or more embodiments, the RF antenna coil 204 is water-cooled. For example, the windings of the antenna coil 204 may be formed of copper tubing through which cooled water or another liquid is passed to thereby transfer heat away from the antenna coil. In this manner, the RF antenna coil 204 is adapted for operation at high RF power levels (e.g., greater than about 1000 watts).

The plasma ion source 200 further includes an electrostatic shield 206, which may be referred to as a Faraday shield, interposed between the RF antenna coil 204 and the dielectric discharge chamber 202. In one or more embodiments, the electrostatic shield 206 is formed having slots or apertures therein and is cylindrical in shape, or otherwise matched to the shape of the dielectric discharge chamber 202. The electrostatic shield 206 functions, at least in part, to reduce a capacitive voltage that develops between the windings of the RF antenna coil 204 and to permit only inductive fields and voltages to enter the interior of the dielectric discharge chamber 202 where the plasma discharge is formed. In addition, the electrostatic shield 206 provides a relatively constant electrical impedance between the RF antenna coil 204 and plasma discharge, which facilitates fast and repeatable ignition of the working gas introduced inside the dielectric discharge chamber 202. As used herein, the term "plasma discharge" refers to the high-density plasma sustained by the RF antenna coil 204. The plasma discharge may be thought of as a resistive element. Accordingly, the plasma discharge essentially acts as a resistive load to the RF antenna coil 204, and hence is generically referred to herein as an impedance since it is a non-DC load. The electrostatic shield 206 also reduces ion energies for better control of material deposition. The RF antenna coil 204, dielectric discharge chamber 202 and electrostatic shield 206, in one or more embodiments, form the plasma generation unit (e.g., 106 in FIG. 1) that is configured to create and sustain the plasma discharge used to form the plasma ion beam.

In one or more embodiments, the plasma generation unit, which includes the RF antenna coil 204, dielectric discharge chamber 202 and electrostatic shield 206, is supported between two metal flanges, including a bottom flange 208, mounted to one end of the dielectric discharge chamber, and a top flange, that is not explicitly shown in FIG. 2 for clarity (but is implied), mounted to an opposing end of the dielectric discharge chamber. The two flanges, which are preferably water cooled, mechanically hold the plasma ion source 200 together and provide a mounting base for other components of the plasma ion source 200, such as the gas distribution unit (102), ignition unit (104) and ion extraction unit (110) (see FIG. 1). As shown in FIG. 2, the flanges (e.g., bottom flange 208) are electrically grounded (e.g., connected to Earth ground) so as to discharge any voltage potential that may develop on the flanges.

The plasma ion source 200 further includes a bias electrode 210 disposed in the interior of the dielectric discharge chamber 202, preferably proximate one end of the dielectric discharge chamber. The bias electrode 210, in one or more embodiments, is electrically isolated (i.e., floating) and forms at least a portion of an electrode bias unit (e.g., 104 shown in FIG. 1), as previously stated; an electrically isolated bias electrode 210 enables RF and DC potentials to be applied. In one or more embodiments, the bias electrode 210 comprises a low sputter yield material, such as, for example, titanium, tungsten, or graphite, with good thermal conductivity. In accordance with an aspect of the invention, a plasma potential of the plasma discharge created by the RF antenna coil 204 is increased by the application of a positive polarity DC potential to the bias electrode 210. The increase in the plasma polarity provides for the creation of a positive electric field gradient that accelerates positive ions (through repulsion) out of the dielectric discharge chamber 202 to form an ion beam.

In order to electrically isolate the bias electrode 210 from the bottom flange 208, which is connected to ground, an insulator 212 is interposed between the bias electrode and the bottom flange. The insulator 212 may be formed of essentially any dielectric material having a suitably high dielectric constant to prevent arcing between the bias electrode 210 and the grounded bottom flange 208, such as, for example, ceramic, fused quartz, etc.

An extraction unit, which in this illustrative embodiment is realized as a single conductive grid 214, is electrically and mechanically connected to the top flange of the plasma ion source 200, which is at ground potential; the top flange is not explicitly shown in FIG. 2 for clarity, but is implied. The use of a single grid, as opposed to using a plurality of grids, beneficially eliminates the need for alignment of the multiple grids, as is often the case in conventional plasma ion source arrangements. As previously stated, the grid 214, in one or more embodiments, is formed having apertures or holes therein to allow for the extraction of a quasi-neutral plasma ion beam. The bias electrode 210 and extraction unit 110 (FIG. 1) preferably interact with each other to accelerate positive ions and electrons in the plasma discharge out of the grid 214.

A gas distribution line 216, which may be part of a gas distribution unit (e.g., 102 shown in FIG. 1) is provided for supplying a non-reactive and/or reactive working gas or gas mixtures into an interior space of the dielectric discharge chamber 202. The gas distribution line 216 preferably passes through openings in the bottom flange 208, insulator 212 and bias electrode 210, and protrudes a prescribed distance above the bias electrode. An igniter electrode or wire 218 is provided in the interior of the dielectric discharge chamber 202 and is configured to ignite the working gas, confined within the discharge chamber, to generate and sustain the plasma. A power supply 220 coupled with the igniter wire 218 provides a source of power for operating the igniter wire. The igniter wire 218 and power supply 220 preferably form at least a portion of the ignition unit 108 shown in FIG. 1. Gas ignition mechanisms (e.g., ignitor wire, glow plug, spark plug, etc.) suitable for use with the plasma ion source 200 according to aspects of the invention will be known by those skilled in the art.

In one or more embodiments, the energy of positive ions is independently and selectively adjusted to achieve a prescribed ion beam energy by controlling a DC positive electrostatic potential applied to the bias electrode 210, such as by way of a variable DC bias voltage supply 222 coupled with the bias electrode. This potential applied to the bias electrode 210 is positive because most of the ions created are electro-positive, and therefore the applied electrostatic potential is positive to repel the mainly positive ions away from the bias electrode. Moreover, the ion current density (i.e., ion dosage) is independently controlled by the electrode bias unit 108 and ion extraction unit 110 from the plasma generation unit 106 (see FIG. 1). This independent control of ion energy and ion current density (dosage) facilitates a wide process window and the ability to tailor ion beam parameters to a variety of applications, such as, but not limited to, ion-assisted deposition, reactive assisted sputtering, pre-cleaning, plasma-enhanced chemical vapor deposition (PECVD).

By way of example only and without limitation, ion energy can be varied from a lowest practical level of about ten electron volts (eV) to over 1,000 eV, depending on a voltage range of the DC bias voltage supply 222. In one or more embodiments, voltages on the order of 100's of volts can be practiced in a DC bias voltage supply range of about 100 to 300 volts. The voltage generated by the DC bias voltage supply 222 is related to the ion energy (in eV), but it is not necessarily a 1:1 correlation. The control of ion energy and ion dosage (i.e., ion current density) is independent of the plasma generation unit 106 (FIG. 1) whose primary function is to create and sustain the plasma discharge. Furthermore, the operation of the plasma generation unit 106 is independent of the electrode bias unit 108 and ion extraction unit 110, in accordance with one or more aspects of the invention.

With continued reference to FIG. 2, the plasma ion source 200 includes an integrated vacuum-compatible matching network 224 coupled between an RF signal generator 226 and one end of the RF antenna coil 204. The matching network, in one or more embodiments, comprises an electric circuit including a high-power capacitor network (e.g., ceramic capacitors) and functions primarily to facilitate efficient coupling of RF power into the dielectric discharge chamber 202 (plasma discharge). Specifically, the capacitor network (not explicitly shown, but implied) forming the matching network 224 is configured to match an impedance of the RF antenna coil 204 at a prescribed frequency of operation of the plasma ion source 200 so as to provide optimal power transfer to the coil from the RF generator 226. Depending upon the type of impedance being matched (e.g., inductive or capacitive), the matching network may, alternatively or in addition to, include an inductor network, and therefore the matching network may be generally considered to include an impedance network.

In one or more embodiments, the matching network 224 utilizes fixed capacitance and/or inductance, and impedance matching is performed by sweeping the applied frequency to thereby tune the matching network for maximum power transfer. As will become apparent to those skilled in the art, maximum power transfer will occur when an impedance of the signal source is matched to an impedance of the load to which the signal source is coupled. Optimal power transfer can be determined, in one or more embodiments, by measuring either forward and/or reflected power, and selecting a frequency which minimizes reflected power and/or maximizes forward power.

Advantageously, according to an important aspect of the invention, the matching network 224 is adapted for integration with the plasma ion source 200 in such a manner that it resides with the plasma ion source in the vacuum chamber during operation. For example, in one or more embodiments the matching network 224 is formed on a high-temperature printed circuit board (not explicitly shown but implied) and is fastened to the bottom source flange 208. It is to be understood, however, that embodiments of the invention are not limited to any specific mounting arrangement for the matching network 224. The matching network 224, in one or more embodiments, is preferably configured having an open center (e.g., "O-shaped" or "C-shaped") so that the electrical line, gas distribution line and the igniter, and/or other feedthroughs, can pass into the dielectric discharge chamber 202. This vacuum-compatible matching network arrangement according to aspects of the invention eliminates the requirement for additional high-power RF and voltage feedthroughs that are prone to arcing and/or generation of parasitic plasma discharges that reduce power transfer to the RF antenna coil 204 and plasma discharge, as previously stated. It also allows enhanced freedom to place the plasma ion source 200 inside the vacuum chamber without consideration for the location of the matching network 224 and its associated cables and feedthroughs.

In one or more embodiments, the matching network 224 is connected with the DC bias voltage supply 222 and bias electrode 210, in addition to the RF generator 226. In this regard, a portion of the RF power supplied by the RF generator 226 that is applied to the RF antenna coil 204 is tapped via a capacitive voltage divider (not explicitly shown but implied) included in the matching network 224. Just like resistors, capacitors placed in series with a voltage source form a voltage divider network, with the capacitor having the smallest capacitance developing the largest voltage across it. Thus, the capacitive voltage divider in the matching network 224 delivers, to the bias electrode 210, a prescribed portion of the RF power and voltage from the RF generator 226, with the amount of power delivered being controlled as a function of a ratio of capacitance associated with the capacitors forming the capacitive voltage divider. Using this capacitive voltage divider arrangement, embodiments of the invention are able to utilize a single RF power generator for supplying power to both the RF antenna coil 204 and the bias electrode 210, thereby eliminating phase mismatch between the RF antenna coil and bias electrode exhibited as a result of using multiple power supplies. This phase mismatch has been a cause of arcing and high reflected powers which could otherwise damage the RF generator 226.

As previously described, the RF power and voltage delivered to the bias electrode 210 is used to accelerate a sufficient flux of electrons out of the extraction grid 214 to neutralize the positive space charge created by the positive ions accelerated by the ion extraction unit 110 (FIG. 1) to form an ion beam. The neutralization of the positive space charge of the ion beam by the electrons generated by the plasma discharge is referred to as self-neutralization. The self-neutralized ion beam generated by the plasma ion source 200 according to aspects of the invention is quasi-neutral and does not require additional electron charge compensation from, for example, a thermionic filament, hollow-cathode emitter, plasma bridge neutralizer, or other secondary or auxiliary neutralization mechanisms typically employed by conventional plasma sources. Without space charge compensation, the positive ion beam would generate space charge arcing within the vacuum chamber, on substrate parts to be coated, cleaned, or treated, and on fixtures used to hold the substrate parts. Arcing can result in parts becoming contaminated and failing to meet performance expectations; for example, optical absorption may be too high. Additionally, a separate (secondary) electronic emitter is a maintenance item and requires replacement or could otherwise lead to the plasma ion source failing to operate properly. Thus, the self-neutralization feature of embodiments of the invention essentially eliminate the operational and maintenance issues often associated with conventional arrangements.

The application of an RF voltage on the bias electrode 210 creates a desired positive polarity self-bias on the bias electrode when the surface area of the bias electrode is at least about three times the surface area of a grounded surface in contact with the plasma discharge generated by the RF antenna coil 204, according to aspects of the invention. Hence, in one or more embodiments, the extraction unit (110 in FIG. 1) is implemented using a single perforated metallic grid or mesh placed at the end of the dielectric discharge chamber 202, opposite the bias electrode 210, to perform as a grounded surface and to extract ions from the plasma discharge. The surface area of the perforated metallic grid or mesh is configured to be at least three times smaller than the bias electrode 210, and more preferably has a surface area that is about 3.5 to 5 times smaller.

Another benefit of this arrangement of surface area ratios between the bias electrode 210 and the extraction grid 214 is the creation of a sufficiently negative electric field during the negative polarity cycle of the applied RF voltage to accelerate electrons from the plasma discharge away from the bias electrode (repelling force) and out of the plasma ion source 200 through the extraction grid as well. The simultaneous and coincident acceleration of positive ions and electrons allows for a quasi-neutral ion beam without the need for a secondary electron source, as previously explained. In other words, the positive space charge created by the beam of positive ions is neutralized by a flux of electrons created by the plasma discharge inside the dielectric discharge chamber 202. These electrons are accelerated out of the plasma ion source 200 by the self-bias electric field created by the bias electrode 210 due to the satisfaction of the surface area ratio described above. Consequently, the positive charge of the ions extracted and accelerated through the extraction grid 214 is beneficially neutralized by these plasma discharge electrons and creates a quasi-neutral or self-neutralized ion beam. This condition is met for all operational conditions of the source, for example, RF power, DC bias potential, gas flows and gas types, according to one or more embodiments.

Figure 3:
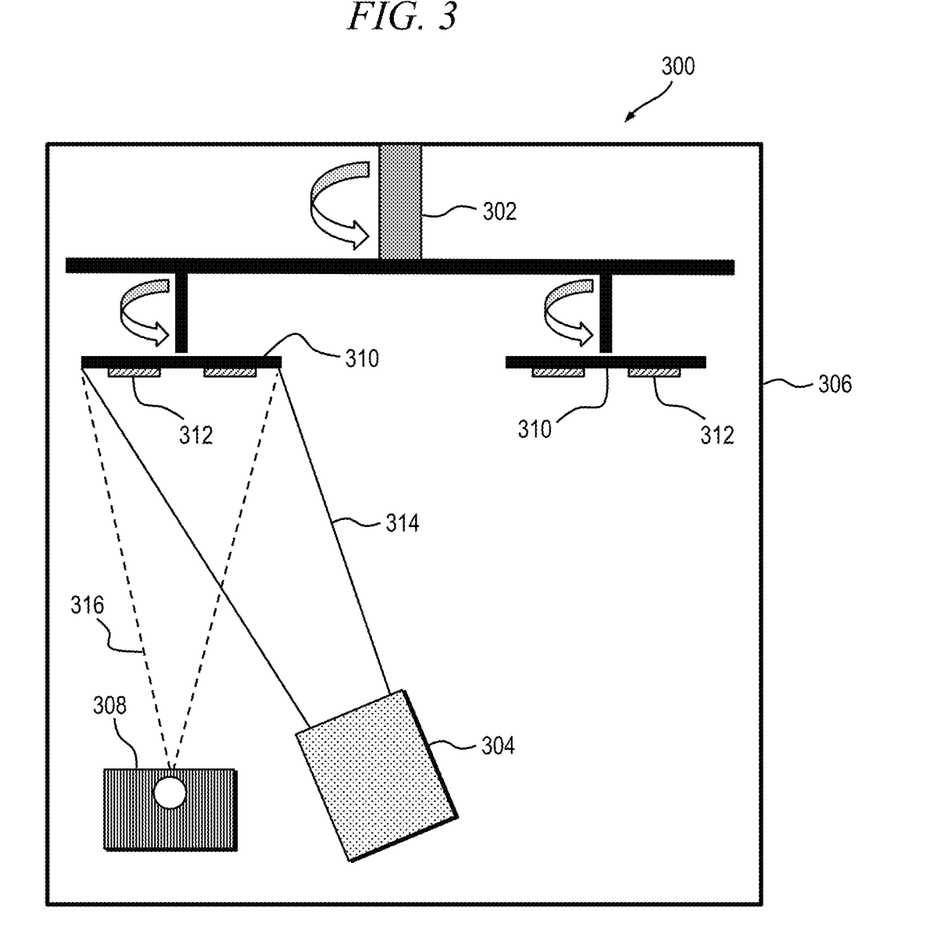
FIG. 3 is a side view conceptually illustrating at least a portion of the exemplary apparatus shown in FIG. 2 placed in a precision optical coater with planetary fixture, according to an embodiment of the present invention.

FIG. 3 is a side view conceptually illustrating at least a portion of the illustrative plasma ion source apparatus 200 shown in FIG. 2 placed in an exemplary precision optical coater 300 with a planetary fixture 302, according to an embodiment of the invention. In this exemplary embodiment, a plasma ion source 304, which may be implemented using the illustrative plasma ion source 200 shown in FIG. 2, is placed in a high vacuum chamber 306 with an electron gun evaporation source 308, planetary fixture 302, planets 310 and substrates 312. The vacuum chamber 302 is evacuated to a high vacuum pressure, preferably in a range of about $10^{-7}$ to about $10^{-6}$ Torr, and more preferably to below about $10^{-5}$ Torr, prior to operation of the electron gun evaporation source 308 and plasma ion source 304.

The plasma ion source 304, in this exemplary embodiment, is positioned in the vacuum chamber 302 such that its emitted ion beam 314 overlaps a vapor plume 316 produced from the melting and evaporation of a source material (not explicitly shown, but implied), such as, for example, titanium dioxide ($TiO_2$), that is placed in a pocket or pockets of the electron gun evaporation source 308. Source materials suitable for use in conjunction with embodiments of the invention may comprise metals (e.g., titanium, molybdenum, tantalum, etc.) or dielectric materials (e.g., titanium dioxide, silicon dioxide, tantalum pentoxide, hafnium oxide, etc.). Substrates 312 to be coated are placed on planets 310 attached to corresponding planetary fixtures 302. The configuration shown in FIG. 3 is one embodiment of an application according to one or more embodiments of the invention involving the deposition of precision multilayer optical coatings using ion beam-assisted deposition.

Figure 4:
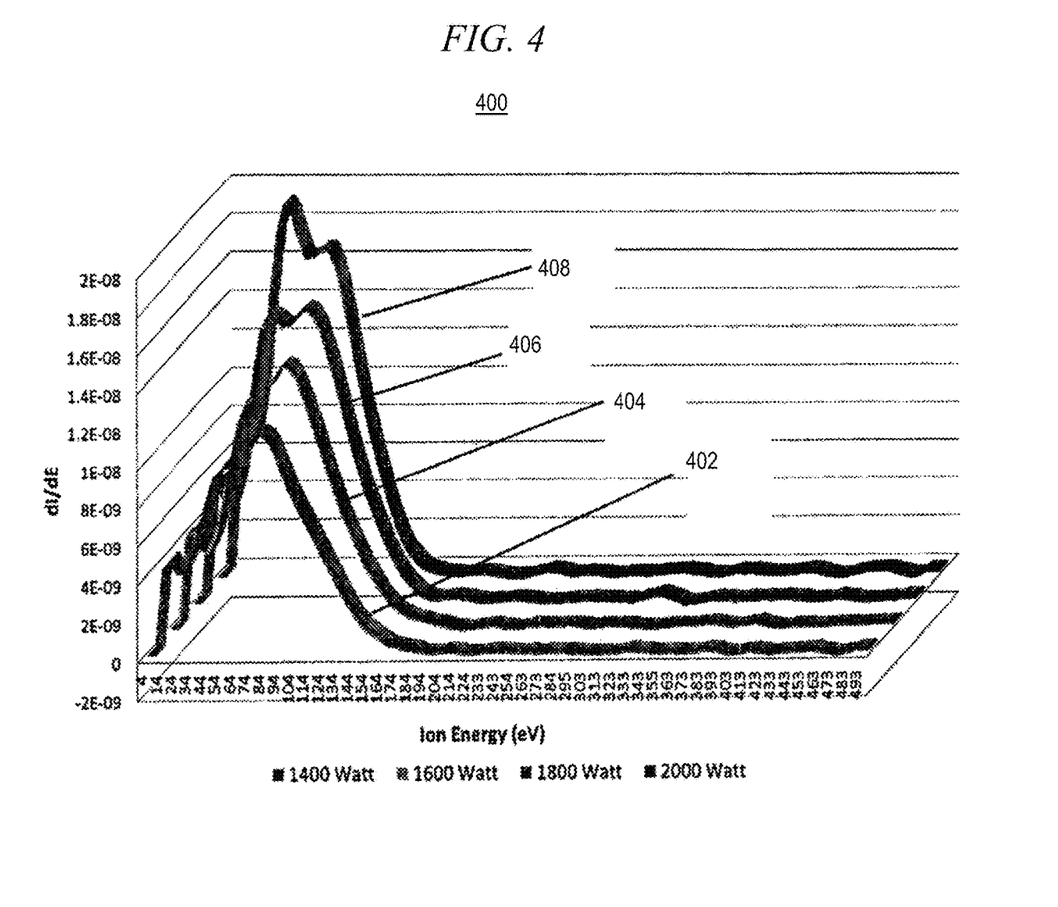
FIG. 4 is a graph with illustrative waveforms depicting measured ion energy distribution in relation to RF power, according to an embodiment of the present invention.

FIG. 4 is a graph 400 with illustrative waveforms depicting measured ion energy distribution in relation to RF power, according to an embodiment of the present invention. In this example, a retarding field energy analyzer (RFEA), commercially available from Impedans Ltd. (Dublin, Ireland), was used to measure ion energy distributions of an oxygen plasma produced using a plasma ion source according to an embodiment of the invention at four different RF power levels—namely, 1400 watts (waveform 402), 1600 watts (waveform 404), 1800 watts (waveform 406), and 2000 watts (waveform 408)—without application of a bias electrode. The plasma ion source was operated at an oxygen gas flow rate of 35 standard cubic centimeters per minute (sccm) and a vacuum chamber pressure of $2 \times 10^{-4}$ Torr. The RFEA was placed on a planet (e.g., 310 in FIG. 3). The graph 400 shows the calculated derivative, dI/dE, of ion flux (I) measured by the RFEA and the electric field (E) applied to a collection grid assembly (not explicitly shown) inside the RFEA on the ordinate (y) axis against ion energy, in electron volts (eV), on the abscissa (x) axis for RF power levels of 1400 watts, 1600 watts, 1800 watts and 2000 watts. In this embodiment, the ion energy distributions are in a range of about 14 eV to about 144 eV, with the average ion energy in a range of about 74 eV to about 84 eV.

Figure 5:
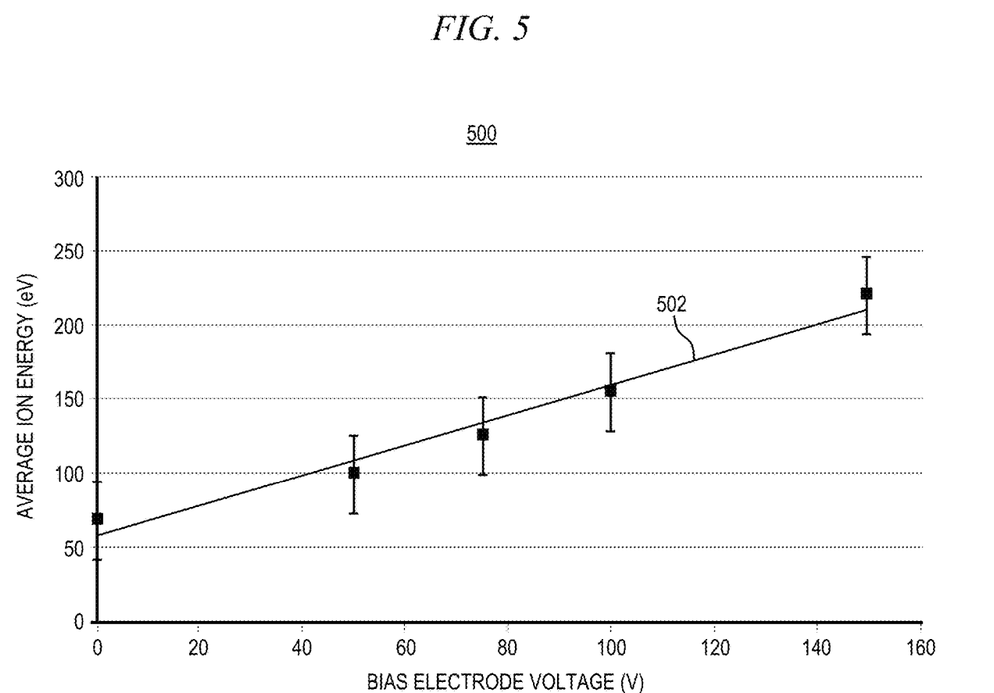
FIG. 5 graphically depicts an exemplary measured average ion energy in relation to bias electrode voltage, according to an embodiment of the present invention.

FIG. 5 is a graph 500 depicting an exemplary measured average ion energy in relation to bias electrode voltage, according to an embodiment of the present invention. The average ion energy was measured using an RFEA. The RFEA was placed on a planet (e.g., 310 in FIG. 3). The average ion energy, in eV, is plotted against bias electrode voltage, in volts, for an oxygen plasma ion beam. In this embodiment, the plasma ion source according to an embodiment of the invention (e.g., plasma ion source 200 shown in FIG. 2) was operated at an oxygen gas flow rate of 35 sccm and a vacuum chamber pressure of $2 \times 10^{-4}$ Torr. An RF power of 2,000 watts was applied to the plasma ion source. As apparent from waveform 502, the average ion energy is increased by a DC voltage applied to the bias electrode (e.g., bias electrode 210 in FIG. 2). The average ion energy is shown to be linearly dependent on DC voltage potential applied to the bias electrode, in this exemplary embodiment. The capability to control the average ion energy advantageously provides for the ability to tailor one or more film properties (e.g., adhesion, stress, physical density, refractive index, extinction coefficient, laser damage, threshold damage, hardness, scratch resistance, moisture stability, etc.) during ion beam-assisted deposition (IBAD), reactive assisted sputtering, or plasma enhanced chemical vapor deposition (PECVD).

Figure 6:
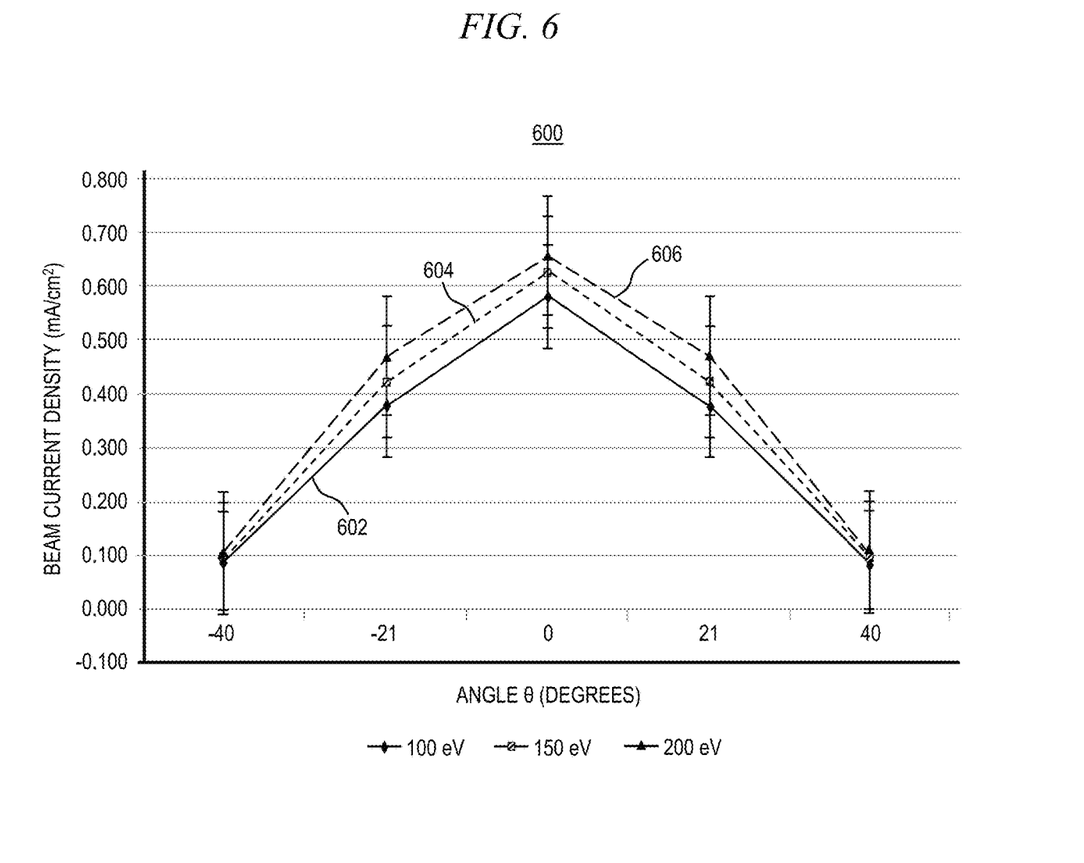
FIG. 6 is a graph with illustrative waveforms depicting exemplary ion beam profiles measured for oxygen ion beams of different excitation energies, according to an embodiment of the present invention.

FIG. 6 is a graph with illustrative waveforms depicting exemplary ion beam profiles 600 measured for oxygen ion beams of different excitation energies, according to an embodiment of the present invention. The exemplary ion beam profiles 600 were measured for oxygen ion beams of 100 eV (waveform 602), 150 eV (waveform 604) and 200 eV (waveform 606). The ion current density was measured using a Faraday cup probe placed at 12 inches from the extraction grid (e.g., 214 in FIG. 2). An angle of the Faraday cup relative to a centerline of the plasma ion source was varied from zero degrees to 40 degrees. The ion energy was measured independently with the RFEA. The grid selected for this exemplary embodiment possessed a flat profile and was comprised of tungsten metal with perforated holes therein. In this embodiment, the ion beam profiles have a similar angular distribution for ion energies of 100 eV, 150 eV and 200 eV, as apparent from waveforms 602, 604 and 606, respectively. The consistency of the ion beam profile shape allows for accurate placement of the plasma ion source (e.g., 304 in FIG. 3) relative to the electron gun evaporation source (e.g., 308 in FIG. 3) in an orientation that provides overlap of the ion beam (314 in FIG. 3) generated by the plasma ion source according to an embodiment of the invention and the vapor plume (e.g., 316 in FIG. 3) of the evaporated source material to ensure full irradiation of substrates (e.g., 312 in FIG. 3) placed on a planet (e.g., 310 in FIG. 3).

Figure 7:
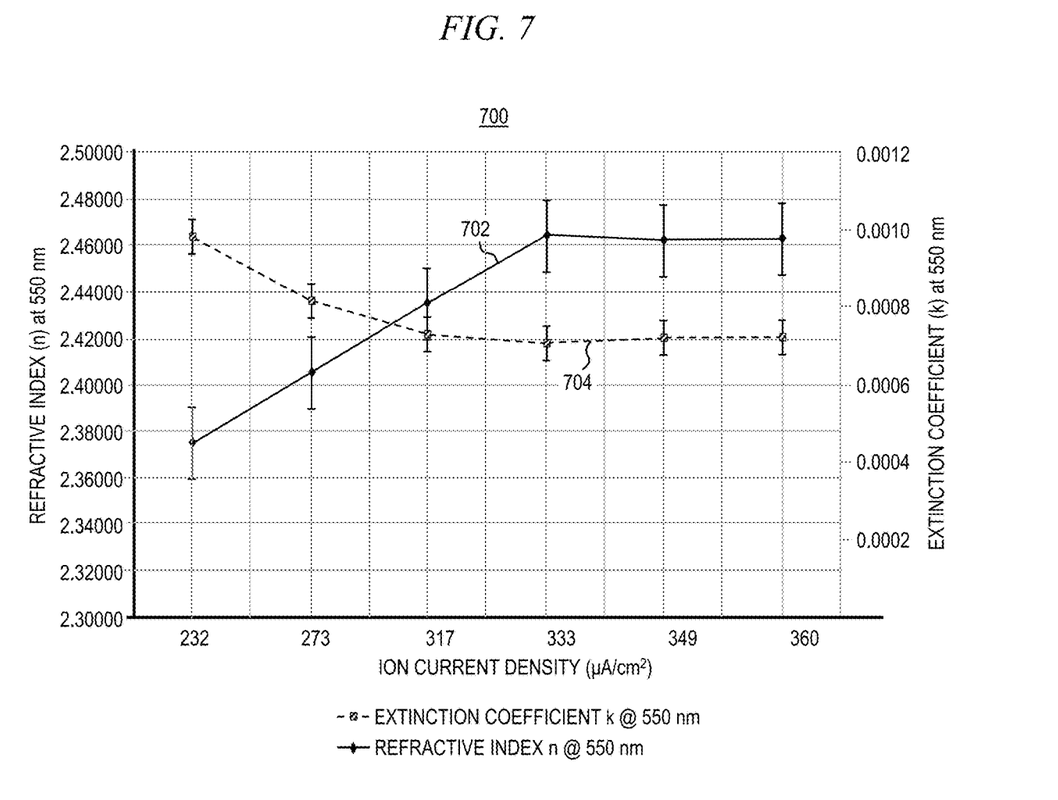
FIG. 7 graphically depicts an exemplary influence of measured ion current density generated by an apparatus according to an embodiment of the invention on a refractive index and extinction coefficient at 550 nanometers (nm) of titanium dioxide optical thin films.

FIG. 7 is a graph 700 depicting exemplary influence of measured ion current density generated by an apparatus according to an embodiment of the invention on a refractive index and extinction coefficient at 550 nanometers (nm) of titanium dioxide optical thin films. By way of example only and without limitation, titanium dioxide ($TiO_2$) films were deposited by electron-beam ion assisted deposition using a plasma ion source in accordance with an embodiment of the invention (e.g., plasma ion source 200 shown in FIG. 2). A precision optical coating system according to an embodiment of the invention (e.g., precision optical coater 300 shown in FIG. 3) was employed. Substrates (e.g., 312 in FIG. 3), comprising optical borosilicate crown glass (BK7) substrates, were placed on a planet (e.g., 310 in FIG. 3). The $TiO_2$ films were deposited to a thickness of about 5,000 Angstroms (Å). During deposition, the film thickness was measured with a quartz crystal microbalance, readily available to one skilled in the art, that was placed inside the vacuum chamber (e.g., 306 in FIG. 3) in proximity to the planetary fixture (e.g., 302 in FIG. 3) and planets. In addition, the film thickness was measured after deposition using a profilometer on masked BK7 glass microscope slides.

The substrates were irradiated with an oxygen plasma ion beam produced by the plasma ion source according to an embodiment of the invention (e.g., plasma ion source 304 in FIG. 3). In this example, an oxygen gas flow rate of 35 sccm and a vacuum chamber pressure of $2\times10^4$ Torr was used. A DC bias power supply (e.g., 222 in FIG. 2) of 180 volts was applied to a bias electrode (e.g., 210 in FIG. 2) of the plasma ion source. Ion current density was measured using Faraday cup probes placed on a planet in a calibration run prior to the film deposition runs. After the deposition runs, the refractive index of the films was determined by measuring the reflection and transmission in a spectrophotometer and analyzing spectra with optical modeling software to calculate the refractive index (n) and extinction coefficient (k). The refractive index (n) is plotted against ion current density in microamperes per cubic centimeter ($\mu A/cm^2$) in plot 702, as illustrated in graph 700. The refractive index (n) is measured to have a range of about 2.368 to 2.462 for ion current densities of about 231.5 $\mu A/cm^2$ to 360.7 $\mu A/cm^2$.

A refractive index of 2.46 is generally considered by those skilled in the art to be a fully dense $TiO_2$ film deposited by ion assisted e-beam evaporation. As illustrated in plot 702, an ion current density of about 332.61 $\mu A/cm^2$ is necessary to achieve a $TiO_2$ refractive index of 2.46, in this example. $TiO_2$ films deposited with an ion current density of less than 332.61 $\mu A/cm^2$ will possess porosity, which may be undesirable for optical coating design applications, such as, for example, an anti-reflective coating or band-pass filter.

Another important optical property is the extinction coefficient (k), which generally represents a measure of optical attenuation per unit length of material. It is desirable to have an extinction coefficient as low as possible, preferably less than about 0.0005. In this example, an extinction coefficient less than 0.0005 is achievable for ion current densities greater than about 310 $\mu A/cm^2$, as shown in plot 704 of graph 700. The exemplary results depicted in FIG. 7 indicate that high optical quality and dense $TiO_2$ films are deposited using the plasma ion source formed in accordance with one or more embodiments of the invention. These films are well suited for a range of demanding precision optical film applications, including, but not limited to, anti-reflective coatings, band-pass filters, cut-off filters, etc.

Figure 8:
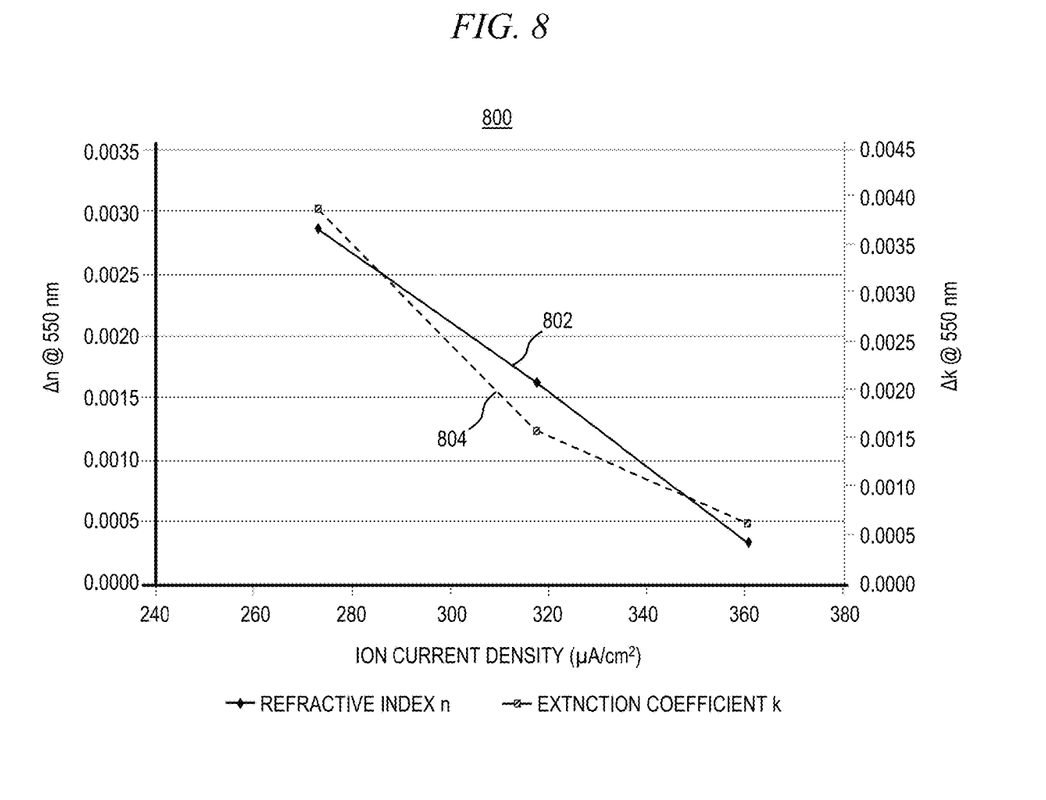
FIG. 8 graphically depicts an exemplary influence of ion current density generated by an apparatus according to an embodiment of the invention on a change in the refractive index and extinction coefficient in a 24-hour period of time.

With reference now to FIG. 8, graph 800 depicts an influence of ion current density on a change in the refractive index ($\Delta n$) and extinction coefficient ($\Delta k$) in a 24-hour period of time generated by a plasma ion source according to an embodiment of the invention. For this example, $TiO_2$ optical films were deposited, using a plasma ion source in accordance with an embodiment of the invention, which demonstrate shift-free moisture stability. A common practice used by those skilled in the art of optical coatings is to measure a change in refractive index ($\Delta n$) and extinction coefficient ($\Delta k$) after soaking an optical film in distilled water for a period of 24 hours. $TiO_2$ films were deposited by ion assisted e-beam evaporation using a plasma ion source according to an embodiment of the invention (e.g., 304 in FIG. 3). The $TiO_2$ films were deposited to a physical thickness of about 5,000 Å. The film thicknesses were measured in-situ by a quartz crystal microbalance and ex-situ by a profilometer. The $TiO_2$ films were deposited on BK7 glass substrates (e.g., 310 in FIG. 3) placed on corresponding planets (e.g., 312 in FIG. 3) in a precision optical coating system (e.g., 300 in FIG. 3).

The refractive index (n) and extinction coefficient (k) were determined, in this example, by measuring the reflection and transmission of film samples in a spectrophotometer and analyzing the spectra with optical modeling software immediately after venting of the vacuum chamber (e.g., 306 in FIG. 3). The film samples were then placed in a distilled water bath whose temperature was maintained at 25 degrees Celsius (° C.)—room temperature—for a period of 24 hours. After 24 hours, the films were removed from the distilled water bath and dried off with high-purity, de-ionized nitrogen gas. The $TiO_2$ film samples were then re-measured in the spectrophotometer and the change in refractive index ($\Delta n$) and extinction coefficient ($\Delta k$) were calculated. Plot 802 in graph 800 depicts the change in refractive index ($\Delta n$) as a function of ion current density ($\mu A/cm^2$), and plot 804 depicts the change in extinction coefficient ($\Delta k$) as a function of ion current density.

It will be appreciated by those skilled in the art that a change in refractive index is related primarily to the porosity of the deposited film. Plot 802 illustrates that films produced with an ion current density of about 320 $\mu A/cm^2$, in accordance with an embodiment of the invention, possess a change in refractive index ($\Delta n$) of less than about 0.002, and films deposited with an ion current density of about 332.61 $\mu A/cm^2$ exhibit an even more desirable $\Delta n$ of less than about 0.001. Plot 804, which depicts the change in extinction coefficient ($\Delta k$) as a function of ion current density, exhibits a similar trend. Specifically, plot 804 indicates that for $TiO_2$ films deposited with an ion current density greater than or equal to about 332.61 $\mu A/cm^2$, the change in extinction coefficient ($\Delta k$) is less than about 0.0001, which is preferred for applications where very stable levels of absorption are required, for example to prevent degradation of a coated optical component. Thus, by using a plasma ion source formed in accordance with one or more embodiments of the invention, one is able to achieve deposited films exhibiting superior moisture shift-free properties, among other advantages, desirable for precision optical applications.

Given the discussion thus far, it will be appreciated that an exemplary high-frequency plasma ion source, according to an embodiment of the invention, comprises a plasma generation unit including a plasma discharge chamber adapted to generate and sustain a plasma confined therein, a gas distribution unit adapted to deliver a working gas into an interior of the plasma discharge chamber, an ignition unit adapted to stimulate ionization of the working gas to thereby generate a stable plasma, an electrode bias unit configured to apply an electrostatic potential to charged species in the plasma discharge, and an ion extraction unit disposed at an end of the plasma discharge chamber opposite the electrode bias unit, the ion extraction unit being configured to accelerate the charged species out of the ion extraction unit to generate an output quasi-neutral plasma ion beam. The plasma ion source further includes a vacuum integrated matching network operatively coupled with the plasma generation unit and the electrode bias unit, the matching network being configured to facilitate optimal power transfer from the plasma generation unit. The matching network resides with the plasma generation unit and electrode bias unit in a vacuum chamber during operation of the plasma ion source.

Given the discussion thus far, it will also be appreciated that an exemplary high-frequency plasma ion source, according to an embodiment of the invention, comprises a plasma generation unit including a plasma discharge chamber adapted to generate and sustain a plasma confined therein, a gas distribution unit adapted to deliver a working gas into an interior of the plasma discharge chamber, an ignition unit adapted to stimulate ionization of the working gas to thereby generate a stable plasma, an electrode bias unit configured to apply an electrostatic potential to charged species in the plasma discharge, and an ion extraction unit disposed at an end of the plasma discharge chamber opposite the electrode bias unit, the ion extraction unit being configured to accelerate the charged species out of the ion extraction unit to generate an output quasi-neutral plasma ion beam. The plasma ion source further includes a vacuum integrated matching network operatively coupled with the plasma generation unit and the electrode bias unit, the matching network being configured to facilitate optimal power transfer from the plasma generation unit. The plasma generation unit and the electrode bias unit are configured such that ion current density in the plasma discharge chamber is controlled as a function of RF power applied to the plasma generation unit, and ion energy is independently controlled as a function of DC and RF bias voltages applied to a bias electrode of the electrode bias unit.

The illustrations of embodiments of the invention described herein are intended to provide a general understanding of the various embodiments, and they are not intended to serve as a complete description of all the elements and features of apparatus, methods and systems that might make use of the techniques described herein. Many other embodiments will become apparent to those skilled in the art given the teachings herein; other embodiments are utilized and derived therefrom, such that structural and logical substitutions and changes can be made without departing from the scope and spirit of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower," "front" and "back," where used, are intended to indicate relative positioning of elements or structures to each other when such elements are oriented in a particular manner, as opposed to defining absolute positioning of the elements.

The corresponding structures, materials, acts, and equivalents of all means or step-plus-function elements in the claims below, as may be used, are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments shown and described herein, and that various other changes and modifications are made therein by one skilled in the art without departing from the scope of the appended claims.

What is claimed is:

1. A high-frequency plasma ion source, comprising:
   a plasma generation unit including a plasma discharge chamber adapted to generate and sustain a plasma confined therein;
   a gas distribution unit adapted to deliver a working gas into an interior of the plasma discharge chamber;
   an ignition unit adapted to stimulate ionization of the working gas to thereby generate a stable plasma;
   an electrode bias unit configured to apply an electrostatic potential to charged species in the plasma discharge chamber;
   an ion extraction unit disposed at an end of the plasma discharge chamber opposite the electrode bias unit, the ion extraction unit being configured to accelerate the charged species in the plasma discharge out of the ion extraction unit to generate an output quasi-neutral plasma ion beam; and
   a vacuum integrated matching network operatively coupled with the plasma generation unit and the electrode bias unit, the vacuum integrated matching network being configured to facilitate optimal power transfer from the plasma generation unit, the vacuum integrated matching network residing with the plasma generation unit and electrode bias unit in a vacuum chamber during operation of the plasma ion source.

2. The plasma ion source of claim 1, wherein the plasma generation unit comprises a radio frequency (RF) antenna coil disposed circumferentially about at least a portion of an exterior surface of the plasma discharge chamber and inductively coupled with the plasma discharge chamber for supplying a source of electromagnetic energy to an interior of the plasma discharge chamber when an RF signal is applied to the RF antenna coil.

3. The plasma ion source of claim 2, wherein a first terminal of the RF antenna coil is connected to ground, and wherein the matching network is coupled between an RF signal generator and a second terminal of the RF antenna coil.

4. The plasma ion source of claim 2, further comprising an electrostatic shield interposed between the RF antenna coil and the plasma discharge chamber, the electrostatic shield having a plurality of apertures therein configured to permit only inductive fields and voltages to enter the interior of the plasma discharge chamber.

5. The plasma ion source of claim 2, wherein the matching network comprises a capacitor network configured to match an impedance of the RF antenna coil at a prescribed frequency of operation of the plasma ion source.

6. The plasma ion source of claim 5, wherein the capacitor network in the matching network has a fixed capacitance, and wherein impedance matching with the RF antenna coil is performed by sweeping a frequency of an applied RF signal to thereby tune the matching network for maximum power transfer.

7. The plasma ion source of claim 1, wherein the matching network includes a voltage divider configured to receive a radio frequency (RF) signal applied to the plasma generation unit and to generate, from the applied RF signal, a bias signal that is applied to the electrode bias unit, the bias signal being a prescribed portion of the RF signal.

8. The plasma ion source of claim 1, wherein the plasma discharge chamber is cylindrically shaped and comprises at least one of aluminum oxide ($Al_2O_3$) and fused quartz.

9. The plasma ion source of claim 1, wherein the vacuum integrated matching network is configured having an open center through which at least one of an electrical line, a gas distribution line and an igniter pass into the plasma discharge chamber.

10. A high-frequency plasma ion source, comprising:
a plasma generation unit including a plasma discharge chamber adapted to generate and sustain a plasma confined therein;
a gas distribution unit adapted to deliver a working gas into an interior of the plasma discharge chamber;
an ignition unit adapted to stimulate ionization of the working gas to thereby generate a stable plasma;
an electrode bias unit configured to apply an electrostatic potential to charged species in the plasma discharge chamber;
an ion extraction unit disposed at an end of the plasma discharge chamber opposite the electrode bias unit, the ion extraction unit being configured to accelerate the charged species in the plasma discharge out of the ion extraction unit to generate an output quasi-neutral plasma ion beam; and
a vacuum integrated matching network operatively coupled with the plasma generation unit and the electrode bias unit, the vacuum integrated matching network being configured to facilitate optimal power transfer from the plasma generation unit, the vacuum integrated matching network residing with the plasma generation unit and electrode bias unit in a vacuum chamber during operation of the plasma ion source;
wherein the electrode bias unit comprises a bias electrode disposed in the interior of the plasma discharge chamber, the bias electrode being electrically isolated and adapted to receive radio frequency (RF) and direct current (DC) potentials, a plasma potential of a plasma discharge created by the plasma generation unit being controlled as a function of a positive polarity DC potential applied to the bias electrode.

11. The plasma ion source of claim 10, wherein the ion extraction unit comprises a single perforated conductive grid, the conductive grid having a surface area that is at least three times smaller than a surface area of the bias electrode, so that the bias electrode exhibits a positive self-bias potential.

12. The plasma ion source of claim 11, wherein the surface area of the conductive grid is about 3.5 to 5 times smaller than the surface area of the bias electrode.

13. The plasma ion source of claim 11, wherein the conductive grid comprises at least one of tungsten, molybdenum, graphite, titanium, and alloys thereof.

14. A high-frequency plasma ion source, comprising:
a plasma generation unit including a plasma discharge chamber adapted to generate and sustain a plasma confined therein;
a gas distribution unit adapted to deliver a working gas into an interior of the plasma discharge chamber;
an ignition unit adapted to stimulate ionization of the working gas to thereby generate a stable plasma;
an electrode bias unit configured to apply an electrostatic potential to charged species in the plasma discharge chamber;
an ion extraction unit disposed at an end of the plasma discharge chamber opposite the electrode bias unit, the ion extraction unit being configured to accelerate the charged species in the plasma discharge out of the ion extraction unit to generate an output quasi-neutral plasma ion beam; and
a vacuum integrated matching network operatively coupled with the plasma generation unit and the electrode bias unit, the vacuum integrated matching network being configured to facilitate optimal power transfer from the plasma generation unit, the vacuum integrated matching network residing with the plasma generation unit and electrode bias unit in a vacuum chamber during operation of the plasma ion source;
wherein the plasma generation unit and the electrode bias unit are configured such that ion current density in the plasma discharge chamber is controlled as a function of radio frequency (RF) power applied to the plasma generation unit, and ion energy is independently controlled as a function of direct current (DC) and RF bias voltages applied to a bias electrode of the electrode bias unit.

* * * * *